United States Patent
Farkas et al.

(10) Patent No.: US 12,355,448 B2
(45) Date of Patent: Jul. 8, 2025

(54) SLEW RATE IN LOW-SPEED DATA COMMUNICATION INTERFACES

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 37 days.

(21) Appl. No.: 18/362,411

(22) Filed: Jul. 31, 2023

(65) Prior Publication Data

US 2025/0047269 A1   Feb. 6, 2025

(51) Int. Cl.
*H03K 5/12*   (2006.01)
*H03K 5/05*   (2006.01)

(52) U.S. Cl.
CPC .......... *H03K 5/12* (2013.01); *H03K 5/05* (2013.01)

(58) Field of Classification Search
CPC ...................................................... H03K 5/12
See application file for complete search history.

(56) References Cited

U.S. PATENT DOCUMENTS

| | | | | |
|---|---|---|---|---|
| 3,930,171 | A * | 12/1975 | Takahashi | H03K 17/64 327/110 |
| 5,469,095 | A * | 11/1995 | Peppiette | H03K 17/664 327/309 |
| 5,638,012 | A * | 6/1997 | Hashimoto | G11B 19/02 |
| 5,959,473 | A * | 9/1999 | Sakuragi | H03K 17/164 327/108 |
| 5,986,832 | A * | 11/1999 | Barnett | G11B 5/022 |
| 6,335,643 | B1 * | 1/2002 | Ono | G11B 5/02 327/108 |
| 6,922,041 | B2 * | 7/2005 | Goder | H02M 1/36 323/275 |
| 9,627,954 | B2 * | 4/2017 | Pancholi | H02M 3/1584 |
| 9,853,632 | B2 | 12/2017 | Hu et al. | |
| 10,056,182 | B2 * | 8/2018 | Murtagian | H01F 17/045 |
| 10,389,339 | B2 | 8/2019 | Hashimoto et al. | |
| 11,451,138 | B2 * | 9/2022 | Alfawy | H02M 1/38 |

* cited by examiner

*Primary Examiner* — Thomas J. Hiltunen
(74) *Attorney, Agent, or Firm* — Larson Newman, LLP

(57) ABSTRACT

A circuit includes an inductive circuit trace and a nonlinear device. The circuit conducts a signal input to a load. The circuit trace receives the signal input at a first end of the circuit trace and provides the signal input to the load at a second end of the circuit trace. The nonlinear device is coupled at the second end and is configured to increase a voltage rise time of the signal input.

8 Claims, 4 Drawing Sheets

SLEW RATE IN LOW-SPEED DATA COMMUNICATION INTERFACES

FIELD OF THE DISCLOSURE

This disclosure generally relates to information handling systems, and more particularly relates to improving the slew rate of low-speed data communication interfaces in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A circuit may include an inductive circuit trace and a nonlinear device. The circuit may conduct a signal input to a load. The circuit trace may receive the signal input at a first end of the circuit trace and provide the signal input to the load at a second end of the circuit trace. The nonlinear device may be coupled at the second end and may be configured to increase a voltage rise time of the signal input.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
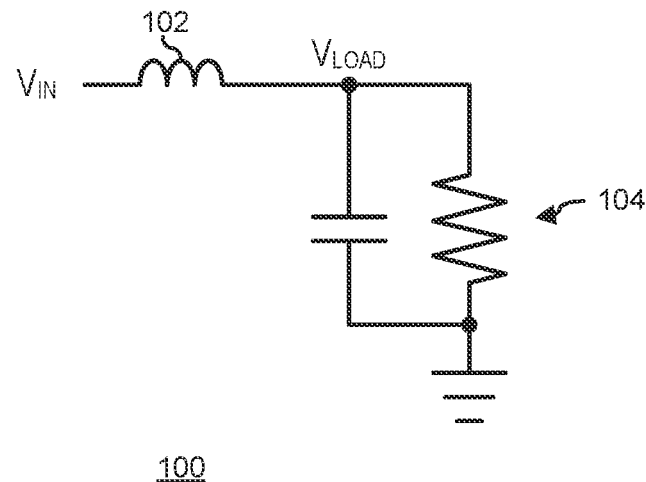
FIG. 1 illustrates a low-speed data communication interface as may be known in the art.
Figure 1:
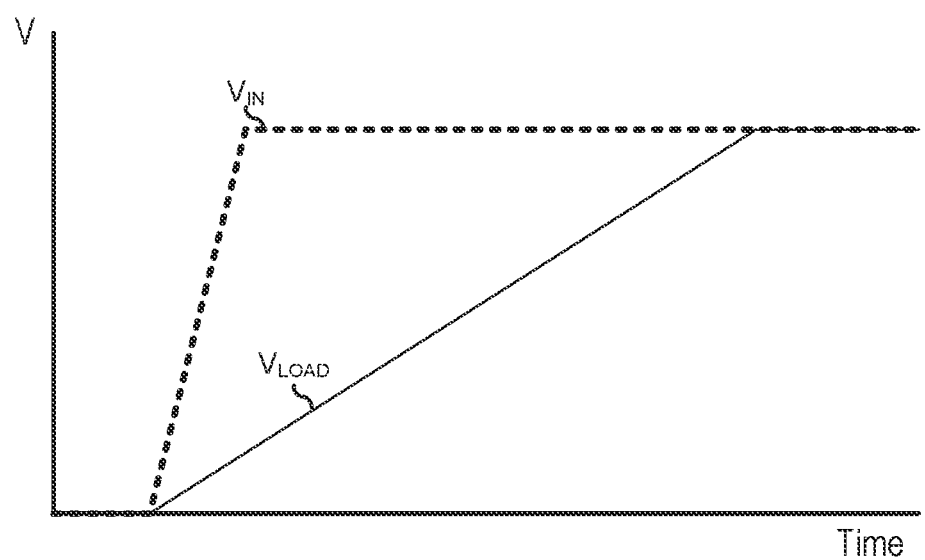

FIG. 1 illustrates a circuit model 100 of a low-speed data communication interface as may be known in the art. Circuit model 100 includes a signal input ($V_{IN}$) that is transmitted through a circuit trace 102 to a load 104. Low-speed data communication interfaces are typically routed over longer distances in a motherboard of an information handling system than would be the case for high-speed data communication interfaces. In particular, low-speed data communication interfaces are typically utilized for various monitoring, management, and maintenance operations, human interface devices, or other functions and features that do not necessitate high bandwidth communications. As such, low-speed data communication interfaces may typically be routed to devices on the motherboard that are more remote from each other, and the trace routing may utilized longer paths, thereby reserving the shorter trace paths for the high-speed data communication interfaces. As such, circuit trace 102 is modeled as an inductive element. Load 104 is modeled as a parallel resistor-capacitor (RC) circuit. It will be noted that the typical low-speed data communication interface may be modeled by other circuit elements, as needed or desired.

FIG. 1 further illustrates a graph 110 of the voltage versus time for the signal input ($V_{IN}$) and the associated voltage at load 106 ($V_{LOAD}$). Note that the signal input ($V_{IN}$) has a steep rise time, but that the corresponding voltage at load 104 ($V_{LOAD}$) has a much slower rise time due to the inductive nature of circuit trace 102 and the capacitive nature of the load. For this reason, low-speed data communication interfaces can suffer reliability issues when the slew rate (i.e., the rise time) for a signal as seen at a load does not meet a slew rate specification for the particular low-speed data communication interface. Note that graph 110 does not show corresponding values for the voltage and time axis, because the particular values may be dictated by the type of low-speed data communication interface, and the associated specifications. Examples of low-speed data communication interfaces may include a Serial Peripheral Interface (SPI), a Low Pin Count (LPC) interface, a System Management Bus (SMBus) interface, an Inter-Integrated Circuit (I2C) interface, or the like.

It has been understood by the inventors of the current disclosure that an inductive element, such as circuit trace 102, stores energy in the form of a magnetic field while a current is flowing. Then, when the current is interrupted, the field collapses and the voltage across the inductive element jumps in accordance with $V=-L*dI/dt$. In a particular embodiment, the voltage spike in the inductive element is used to sharpen the rising edge of a signal in a low-speed data communication interface. By further utilizing a nonlinear element to switch the inductor current on the rising edge, the sharpening effect is enhanced.

Figure 2:
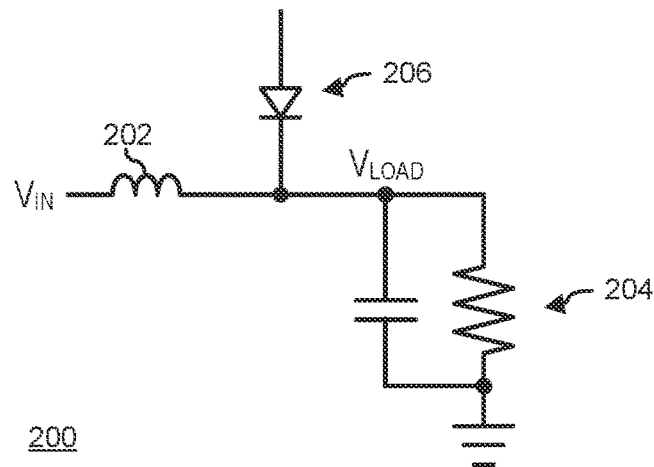
FIG. 2 illustrates a low-speed data communication interface according to an embodiment of the present disclosure.
Figure 2:
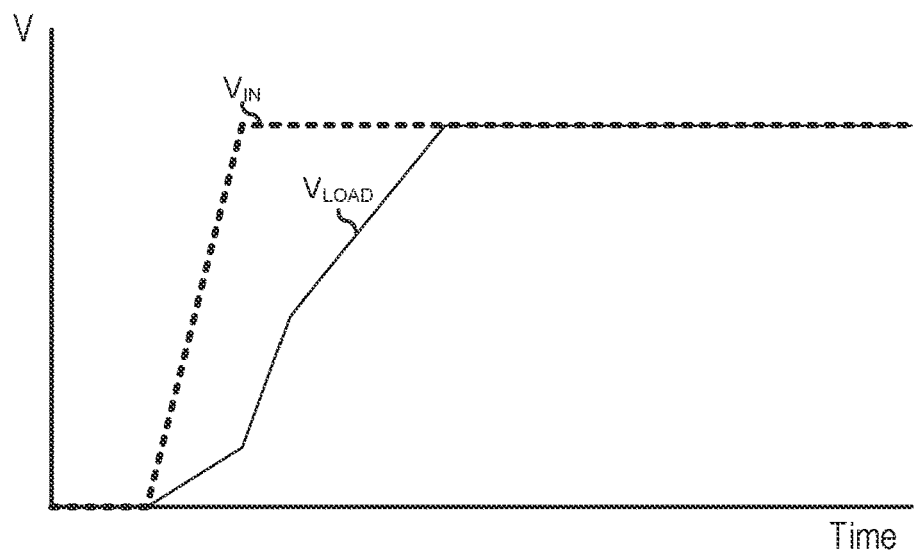

FIG. 2 illustrates a circuit model 200 of a low-speed data communication interface according to an embodiment of the current disclosure. Circuit model 200 includes a signal input ($V_{IN}$) that is transmitted through a circuit trace 202 to a load 204. The cathode of a diode 206 is connected between circuit trace 202 and load 204, and the anode of the diode is connected to a positive voltage source ($V_{CC}$). Diode 206 is the nonlinear element. Note that when switching from the conducting to the blocking state, diode 206 has stored charge that must first be discharged before the diode blocks reverse current. This discharge takes a finite amount of time known as the reverse recovery time. During this time, diode current flows in the reverse direction. This behavior is utilized to advantage because, during the reverse recovery time the inductor current in circuit trace 202 builds up further and produces a large voltage spike.

Figure 3A:
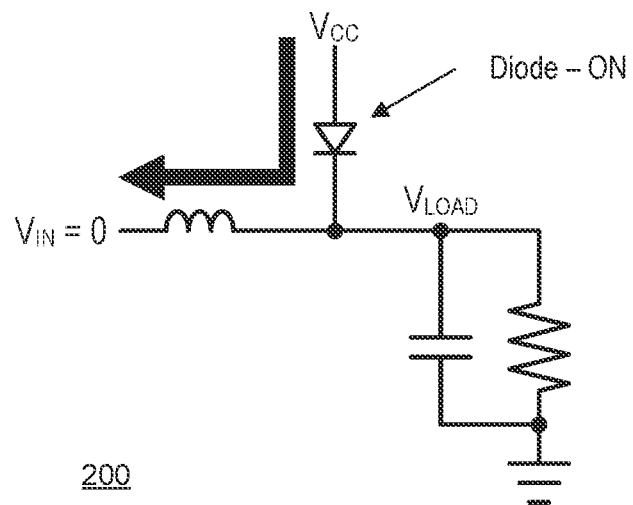
FIGS. 3A-3C illustrate the operation of a low-speed data communication interface according to an embodiment of the present disclosure.
Figure 3B:
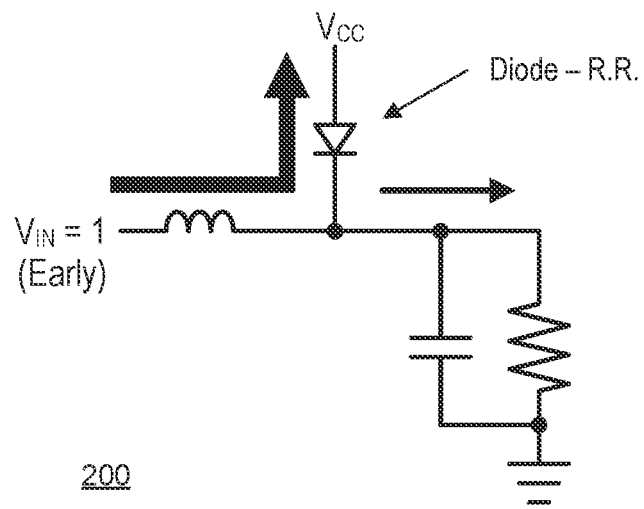
Figure 3C:
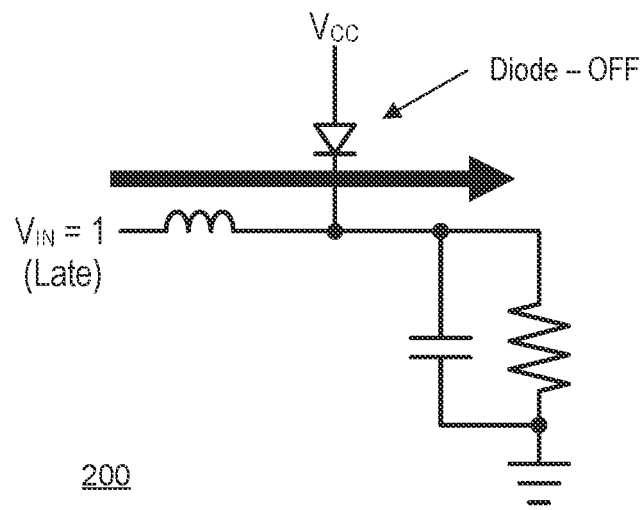

FIGS. 3A-3C illustrate various stages of operation of a circuit model 300 similar to circuit model 200. However, circuit model 300 is simplified to illustrate only the behavior of the nonlinear element in transitions of a signal input ($V_{IN}$) from a low (0) state to a high (1) state, and the operation of a low-side nonlinear element, such as diode 206, is not illustrated for clarity of illustration. However, the operation of a low-side nonlinear element, such as diode 206, will be easily understood in the context of transitions of the signal input ($V_{IN}$) from the high (1) state to the low (0) state. In FIG. 3A, the signal input is in the low (0) state, and diode 206 is forward biased and a current flows through circuit trace 202 to the signal input ($V_{IN}$).

FIG. 3B illustrates the case when the signal input ($V_{IN}$) begins its transition from the low (0) state to the high (1) state, while the diode is in reverse recovery. Here, the current in the circuit trace gradually reverses direction, with most of the current flowing into the diode in the reverse direction because the reverse recovery charge on the diode keeps the diode conducting. During this time, a small current flows to the load and begins to charge up the capacitor. In FIG. 3C, the reverse recovery charge on the diode has drained away, and the diode is reversed biased and hence is an open circuit. The abrupt opening of the diode results in the remaining current in the circuit trace being dumped into the load.

Returning to FIG. 2, a graph 210 of the voltage versus time for the signal input ($V_{IN}$) and the associated voltage at load 204 ($V_{LOAD}$) is illustrated. Note that the signal input ($V_{IN}$) has a steep rise time, and that initially the corresponding voltage at load 204 ($V_{LOAD}$) has a much slower rise time due to the inductive nature of circuit trace 202 and the capacitive nature of the load. However, when the reverse recovery charge on diode 206 is drained and the diode opens, the inductive current is dumped into load 204, as illustrated by the steep jump in the voltage at the load ($V_{LOAD}$). After the inductive current built up in circuit trace 202 is discharged, the rising edge of the voltage at the load ($V_{LOAD}$) rises normally, as the driver of the signal input ($V_{IN}$) continues to charge the capacitor of load 204.

In a typical case, where the prior art low-speed data communication interface 100 may experience a slew rate of as low as 0.03 volts per nanosecond (V/ns), low-speed data communication interface 200 may provide a slew rate of as high as 0.5 V/ns. Moreover, the shape of the rising edge of the voltage at load 204 ($V_{LOAD}$) may be tuned by adjusting the value of the inductance of circuit trace 202, by adjusting the value of the diode current or the type of diode 206 (i.e., by selecting a diode with a longer or a shorter reverse recovery time, etc.), or both. It will be understood that where load 204 has a larger input capacitance, a higher inductor current will be desirable to more rapidly charge the capacitor and to improve the signal rise time. In a particular embodiment, a second nonlinear element is utilized to hasten the fall time of a signal input at a load. For example, the cathode of a second diode can be connected between the circuit trace and the load, and the anode of the second diode can be connected to the ground plane. In this case, the reverse recovery time of the second diode is utilized to rapidly discharge the stored charge on the capacitor of the load during transitions of the signal input ($V_{IN}$) from the high (1) state to the low (0) state, thereby improving the fall time of the voltage at the load ($V_{LOAD}$).

Figure 4:
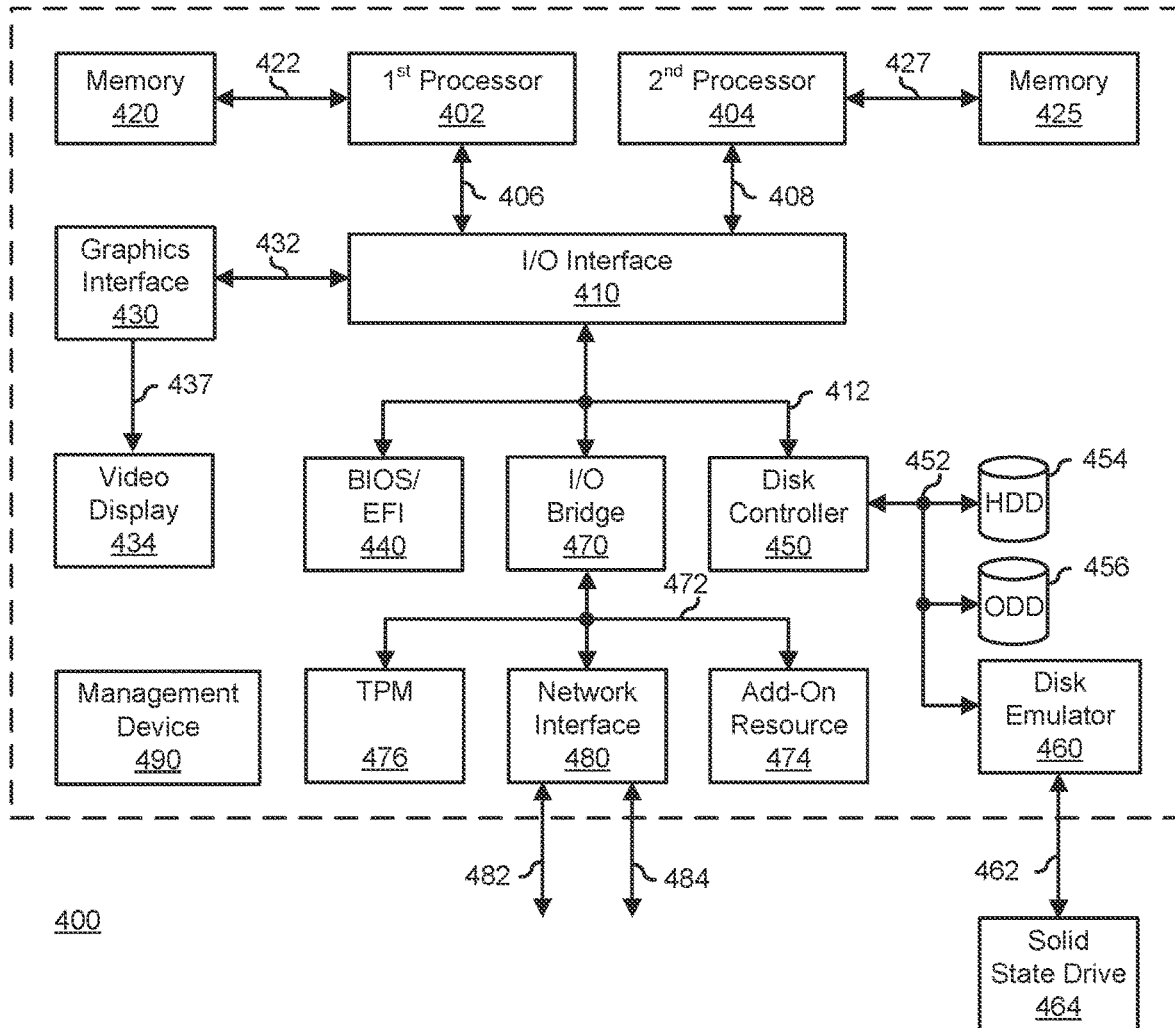
FIG. 4 is a block diagram of a general information handling system according to an embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 4394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A circuit for conducting a signal input to a load, the circuit comprising:
    an inductive circuit trace to receive the signal input at a first end of the circuit trace, and to provide the signal input to the load at a second end of the circuit trace; and
    a nonlinear device coupled at the second end and configured to increase a voltage rise time of the signal input;
    wherein:
        when the signal input is in a low state, the non-linear element is in a conducting state and drives a current into the circuit trace to a source of the input signal;
        when the signal input transitions from the low state to a high state, the non-linear element enters a reverse recovery state that increases the current through the circuit trace, such that a voltage at the load increases at a first rate until a reverse recovery charge on the non-linear element is depleted;
        after the reverse recovery charge is depleted, the non-linear element enters an open-circuit state, and the voltage at the load increases at a second rate until an inductive current from the circuit trace is depleted; and
        after the inductive current is depleted, the voltage at the load increases at a third rate, wherein the first rate is lower than the third rate and the third rate is lower than the second rate.

2. The circuit of claim 1, wherein the nonlinear device includes a diode.

3. The circuit of claim 2, wherein a cathode of the diode is coupled at the second end of the circuit trace.

4. The circuit of claim 3, wherein an anode of the diode is coupled to a positive voltage source.

5. A method for conducting a signal input to a load, the method comprising:
    providing an inductive circuit trace to receive the signal input at a first end of the circuit trace, and to provide the signal input to the load at a second end of the circuit trace; and
    providing a nonlinear device coupled at the second end and configured to increase a voltage rise time of the signal input;
    wherein:
        when the signal input is in a low state, the non-linear element is in a conducting state and drives a current into the circuit trace to a source of the input signal;
        when the signal input transitions from the low state to a high state, the non-linear element enters a reverse recovery state that increases the current through the circuit trace, such that a voltage at the load increases at a first rate until a reverse recovery charge on the non-linear element is depleted;
        after the reverse recovery charge is depleted, the non-linear element enters an open-circuit state, and the voltage at the load increases at a second rate until an inductive current from the circuit trace is depleted; and
        after the inductive current is depleted, the voltage at the load increases at a third rate, wherein the first rate is lower than the third rate and the third rate is lower than the second rate.

6. The method of claim 5, wherein the nonlinear device includes a diode.

7. The method of claim 6, wherein a cathode of the diode is coupled at the second end of the circuit trace, and an anode of the diode is coupled to a positive voltage source.

8. A printed circuit board, comprising:
    a source device configured to provide a signal input;
    an inductive circuit trace to receive the signal input at a first end of the circuit trace;
    a load configured to receive the signal input at a second end of the circuit trace; and
    a diode device coupled at the second end and configured to increase a voltage rise time of the signal input;
    wherein:
        when the signal input is in a low state, the diode is in a conducting state and drives a current into the circuit trace to a source of the input signal;
        when the signal input transitions from the low state to a high state, the diode enters a reverse recovery state that increases the current through the circuit trace, such that a voltage at the load increases at a first rate until a reverse recovery charge on the non-linear element is depleted;
        after the reverse recovery charge is depleted, the diode enters an open-circuit state, and the voltage at the load increases at a second rate until an inductive current from the circuit trace is depleted; and
        after the inductive current is depleted, the voltage at the load increases at a third rate, wherein the first rate is lower than the third rate and the third rate is lower than the second rate.

* * * * *